United States Patent [19]
Kwon

[11] Patent Number: 5,731,221
[45] Date of Patent: Mar. 24, 1998

[54] ISOLATION METHOD IN A SEMICONDUCTOR DEVICE

[75] Inventor: O-Sung Kwon, Ich'on, Rep. of Korea

[73] Assignee: Hyundai Electronics Industries Co., Ltd., Ich'on, Rep. of Korea

[21] Appl. No.: 781,728

[22] Filed: Jan. 10, 1997

[30] Foreign Application Priority Data

Jan. 11, 1996 [KR] Rep. of Korea ............... 96-0444

[51] Int. Cl.[6] ................................................ H01L 21/76
[52] U.S. Cl. ........................ 437/67; 437/69; 437/70; 437/228 TR; 437/228 ME; 148/DIG. 50
[58] Field of Search ........................ 437/69, 70, 72, 437/228 TR, 228 MEM, 67; 148/DIG. 50

[56] References Cited

U.S. PATENT DOCUMENTS

| | | | |
|---|---|---|---|
| 4,745,081 | 5/1988 | Beyer et al. | 437/38 |
| 5,362,669 | 11/1994 | Boyd et al. | 437/67 |
| 5,468,676 | 11/1995 | Madan | 437/67 |
| 5,470,782 | 11/1995 | Schwalke et al. | 437/70 |
| 5,571,738 | 11/1996 | Paterson et al. | 437/70 |

*Primary Examiner*—Trung Dang
*Attorney, Agent, or Firm*—Ware, Fressola, Van Der Sluys & Adolphson LLP

[57] ABSTRACT

The present invention discloses an isolation method in a semiconductor device. The method includes the steps of: forming a pad oxide film, a buffer polysilicon layer, and a nitride layer in that order on a semiconductor substrate where cell region and peripheral region having respective device isolation regions are defined; etching the nitride layer and the buffer polysilicon layer on the device isolation regions of the cell region and the peripheral region; forming a field oxide layer on the device isolation regions of the cell region and the peripheral region; etching the field oxide layer except for edge portions to expose the substrate in the device isolation regions of the cell region and the peripheral region; forming a first insulating layer on the substrate resulting from the previous etching step; etching the first insulating layer, to form a spacer in the side wall of the field oxide layer on the exposed substrate; etching the exposed substrate to form a trench; forming a second insulating layer on the substrate where the trench is formed, to fill the trench with the second insulating layer; etching the second insulating layer to planarize the surface of the substrate; and removing the nitride layer and the buffer polysilicon layer.

11 Claims, 5 Drawing Sheets

ISOLATION METHOD IN A SEMICONDUCTOR DEVICE

FIELD OF THE INVENTION

This invention generally relates to a method of forming a semiconductor device, and in particular to a method of forming isolation regions in the semiconductor device utilizing a trench technology and LOCOS (Local Oxidation of Silicon) technology.

Generally, LOCOS technology is well known as the isolation technology in a semiconductor device. An isolation technology utilizing LOCOS method has the problems that the field oxide occupies relatively large area of the semiconductor substrate, so that an active area is diminished and that the topology in the semiconductor device becomes higher due to the step between the substrate and the field oxide. As one method of solving these problems, a method of decreasing the size and the height of the field oxide has been proposed.

However, this method incurred the problem that it was difficult to obtain the electrical insulation characteristics in the semiconductor device.

In order to solve the problem in isolation technology utilizing the conventional LOCOS method, SALOT (Self-aligned LOCOS Trench) technology combining the LOCOS method with the trench method has been proposed(Refer to international Electron Device Meeting, 28.2.1, 675–678 pp, 1994).

FIGS. 1A to 1E show the sectional views of the processing steps so as to describe the isolation technology utilizing the conventional SALOT one.

Referring to FIG. 1A, a pad oxide film 2, about 100–120 Å thick, is formed on a semiconductor substrate 1. Next, a buffer polysilicon layer 3, about 600–800 Å thick, is deposited on the pad oxide film 2 so as to buffer the stress applied by an oxidation mask to be formed. As an oxidation mask a nitride layer 4, about 1500–2500 Å thick, is deposited on the polysilicon layer 3 and a photoresist (not shown) is then formed on the buffer polysilicon layer 3 in the conventional photolithographic process. Next, the nitride layer 4, the buffer polysilicon layer 3, and the pad oxide film 2 are etched in sequence utilizing the photoresist as the mask so that device isolation regions of a cell region 1A and a peripheral region 1B are exposed. Field oxide layers 5A and 5B are formed at a thickness of 1000–1100 Å on device isolation regions exposed in the cell region 1A and the periperal region 1B by performing a field oxidation process.

Referring to FIG. 1A, compared to the field oxide layer 5A in the cell region 1A, the field oxide layer 5B in the peripheral region 1B has a large area, relatively.

Referring to FIG. 1B, a polysilicon film is deposited at a thickness of about 900–1000 Å over all sufaces of the structure formed above by a low pressure chemical vapor deposition (LPCVD) process. Poly spacers 6A and 6B are then formed at both side walls of the nitride layer 4 on the field oxide layers 5A and 5B by an anisotropy etch process. A photoresist 7 is next formed so that the field oxide layer 5A and the poly spacer 6A only in the cell region 1A are exposed.

Turnnig now to FIG. 1C, a trench 8 is formed at a thickness of about 2500–3500 Å by etching the field oxide layer 5A in the cell region 1A and the substrate 1, where the photoresist 7 is used as the etch mask in an anisotropy etch process. At this time, the poly spacer 6A is together removed by the anisotropy etch process. The purpose of forming the trench 8 in the substrate 1 of the cell region 1A is to obtain the electrical insulation characteristics by extending the device isolation region to the interior of the substrate 1. In order to prevent the crystal defects due to the etch process for forming the trench 8, a thermal oxidation process is performed, thus forming the oxide thin film 9 within the trench 8.

Referring to FIG. 1D, a CVD oxide layer 10, about 2300–2700 Å thick, is then formed so that the trench 8 is filled up. The oxide layer 10 is then etched by a chemical mechanical polishing (CMP) process until the the nitride layer 4 is completely exposed.

Turning now to FIG. 1E, the remaining nitride layer 4 and polysilicon layer 3 are removed to form device isolation regions 5A' and 5B.

Therefore, at the cell region 1A, the SALOT structure of the CVD oxide layer 10 filled in the trench 8 and the field oxide layer 5A formed by the LOCOS process is provided and, at the peripheral region 1B the device isolation region of the field oxide layer 5B is provided.

However, those conventional isolation techniques have the problems as follows;

First, since a portion of the poly spacers remain after the formation of the trenches due to the misalignment when the photoresist is exposed to the light, a further process is requested to remove the poly spacers.

Second, the masking process for performing the LOCOS process and the masking process for forming the trenches, respectively, are twice required.

Third, the additional thermal oxidation process must be performed to prevent the dislocation formation in the substrate due to the formation of the trenches, so that the process time is lengthened and the yield is decreased.

Fourth, since the surface of the substrate is not planerized, the topology is bad. Therefore, it is difficult to perform the succeeding process.

SUMMARY OF THE INVENTION

It is a general object of the present invention to provide a method of isolating a semiconductor device which can perform the masking process only once by forming the isolation region in the same pattern in both the cell region and the peripherical region in the same form.

It is a more specific object of the present invention to provide a method of isolating a semiconductor device which can enhance the process margin and the integration density by eliminating the difference of the surface topology.

It is another object of the present invention to provide a method of isolating a semiconductor device which can increase the active region by decreasing the birds beak phenomenon through the thickness reduction of the field oxide layer.

In order to achieve these objects, a pad oxide film, a buffer polysilicon layer, and a nitride layer are formed in that order on a semiconductor substrate where cell region and peripheral region having respective device isolation regions are defined. Afterwards, the nitride layer and the buffer polysilicon layer on the device isolation regions of the cell region and the peripheral region are etched. Next, a field oxide layer is formed on the device isolation regions of the cell region and the peripheral region. The field oxide layer with the exception of edge portions is etched to expose the substrate in the device isolation regions of the cell region and the peripheral region. Thereafter, a first insulating layer is formed on the substrate resulting from the previous etching step. Afterwards, the first insulating layer is etched to form a spacer in the side wall of the field oxide layer on the exposed substrate. Next, the exposed substrate is etched to form a trench. Thereafter, a second insulating layer is formed on the substrate where the trench is formed, to fill the trench with the second insulating layer. Afterwards, the second insulating layer is etched to planarize the surface of the substrate. Lastly, the nitride layer and the buffer polysilicon layer are removed.

BRIEF DESCRIPTION OF THE INVENTION

Further objects and advantages of the present invention will be apparent from the following description, reference being had to the accompanying drawings wherein preferred embodiment of the present invention is clearly shown.

In the drawings

FIGS. 1A to 1E are the cross-sectional views of a semiconductor device which illustrate the various fabrication steps in order to explain a conventional isolating method in a semiconductor device, and FIGS. 2A to 2G are the cross-sectional views of a semiconductor device which illustrate the various fabrication steps in order to explain an isolating method in a semiconductor device according to the present invention.

DETAILED DESCRIPTION OF THE INVENTION

Figure 1A:
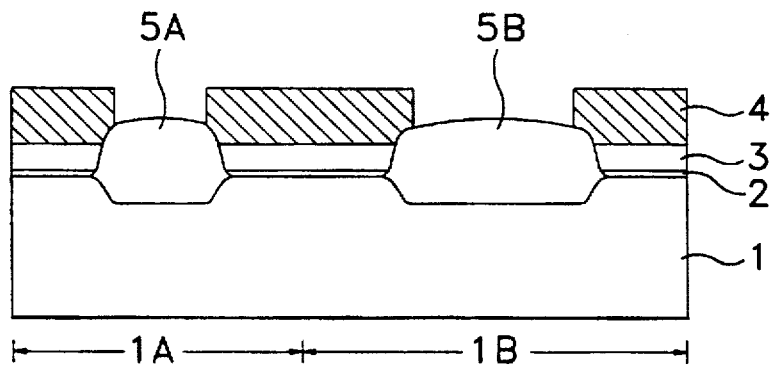
Figure 1B:
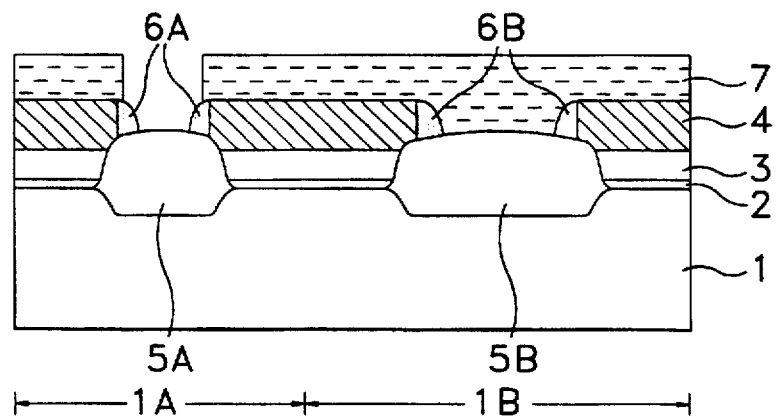
Figure 1C:
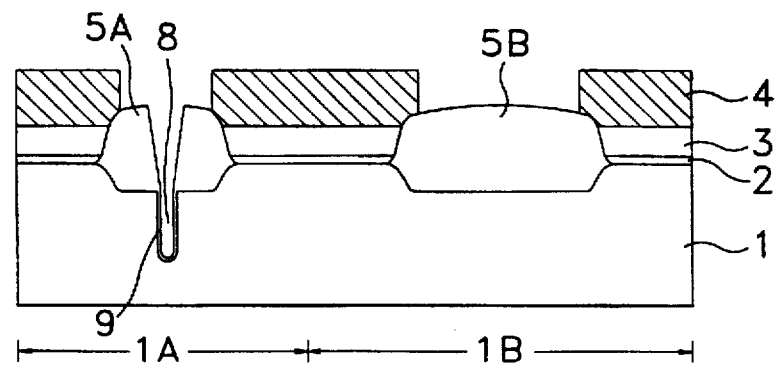
Figure 1D:
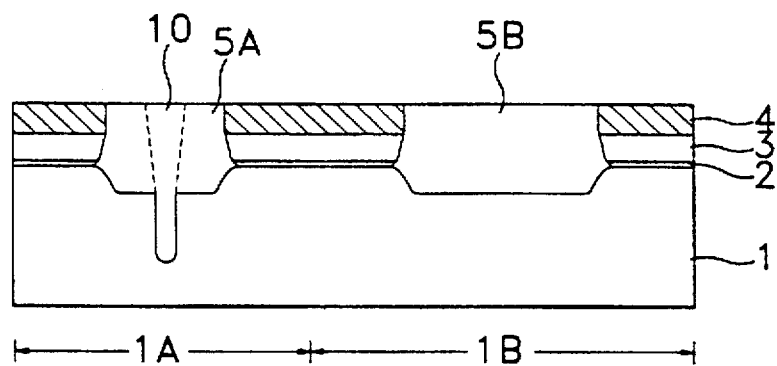
Figure 1E:
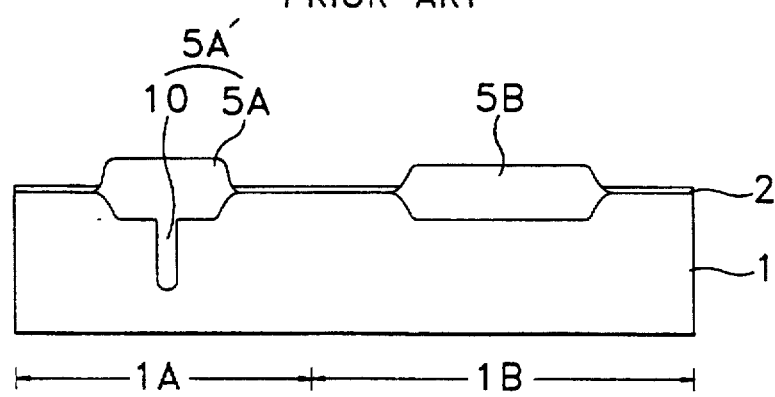
Figure 2A:
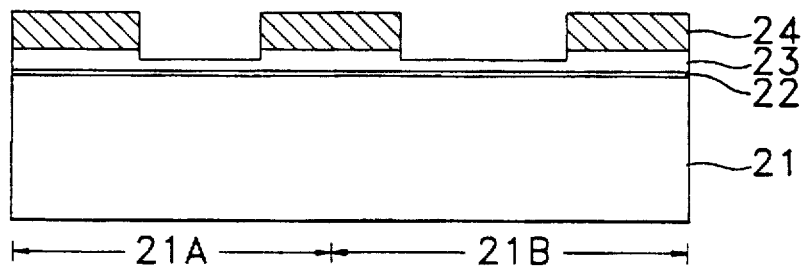

Referring to FIG. 2A, a pad oxide film 22 with the thickness of 150 Å, a buffer polysilicon layer 23 with the thickness of 500 Å, and a nitride layer 24 with the thickness of 2000 Å, respectively are formed in sequence on a semiconductor substrate 21 which defines a cell region 21A and a peripheral region 21B. A phtoresist pattern (not shown) is formed on the nitride layer 24 by performing a conventional photolithography process, and the nitride layer 24 and the nitride layer are then etched using the photoresist pattern as the mask. At this time, the buffer polysilicon layer 23 is etched to the depth where the remaining buffer polysilicon layer in the cell region 21A and in the peripheral region 21B has a thickness of about 200–250 Å and it is preferable to form the photoresist pattern in the minimum line width of about 0.4–0.6 μm so as to meet the current trend for high intergration.

Figure 2B:
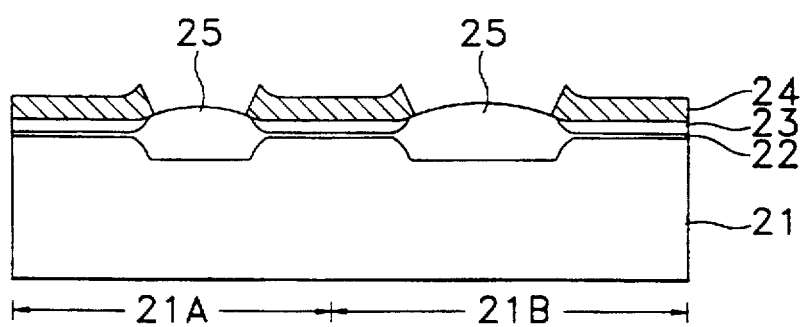

Referring to FIG. 2B, the photoresist pattern is removed and a field oxide layer 25 is then formed in an isolation region between the cell region 21A and the peripheral region 21B. At this embodiment, the field oxide layer 25 about 2,000–3,000 Å thick is formed, which has the thinner thickness than the field oxide layer formed in the conventional field oxidation process.

In this embodiment, the formation of the thin field oxide layer enables to decrease the birds beak phenomenon.

Figure 2C:
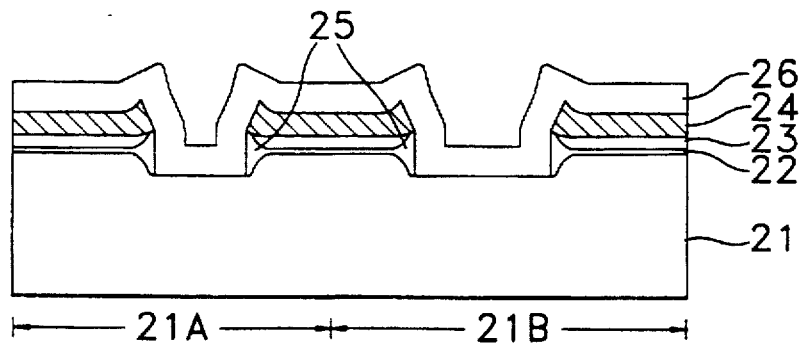

Referring to FIG. 2C, the field oxide layer 25 in the cell region 21A and in the peripheral region 21B is etched by again utilizing the nitride layer 24 of an oxidation mask which was used so as to depress the oxidation of the underlying pad oxide film, as an etch mask. At this time, the field oxide is all etched except the edge regions including the birds beak area. Next, TEOS oxidation layer 26 is deposited with a thickness of about 1800–2200 Å in a low pressure chemical vapor deposition process.

Figure 2D:
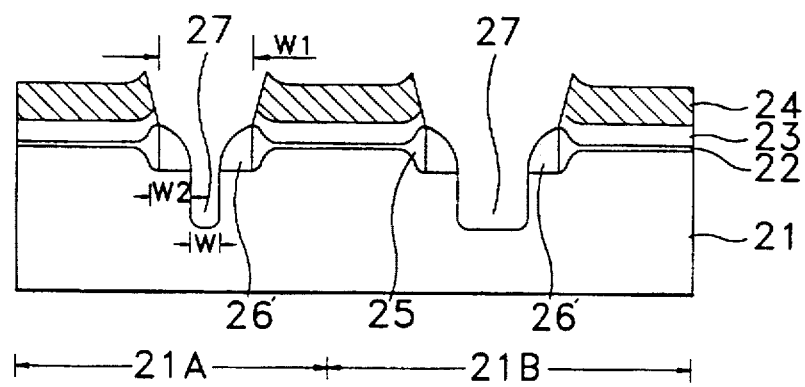

Turning now to FIG. 2D, the TEOS oxidation layer 26 is etched by an anisotropy blanket etch to form a side wall spacer 26' at the etched portion of the field oxide layer 25. At this time, it is preferable to form the spacer at a width of about 0.1–0.2 μm. Following the formation of the sidewalled spacer 26', a trench 27 is formed in both the cell region 21A and the peripheral region 21B by etching the substrate 21 utilizing the mask of the nitride layer 24 and the TEOS spacer 26'. At this time, the trench 27 has a depth of about 0.1–0.3 μm.

In this embodiment, an additional masking process for forming the trench is not required since the nitride layer 24 used as the oxidation mask in the LOCOS process is again used as the etch mask for forming the trench. At this time, the width W of the trench 27 in the cell region 21A is determined based on the space W1 between nitride layer and the adjacent nitride layer and the spacer width W2. That is, W=W1−2W2. For example, if the space W1 is 0.5 μm and the space width W2 is 0.15 μm, the trench width W is 0.2 μm (=0.5 μm−2×0.15 μm).

Figure 2E:
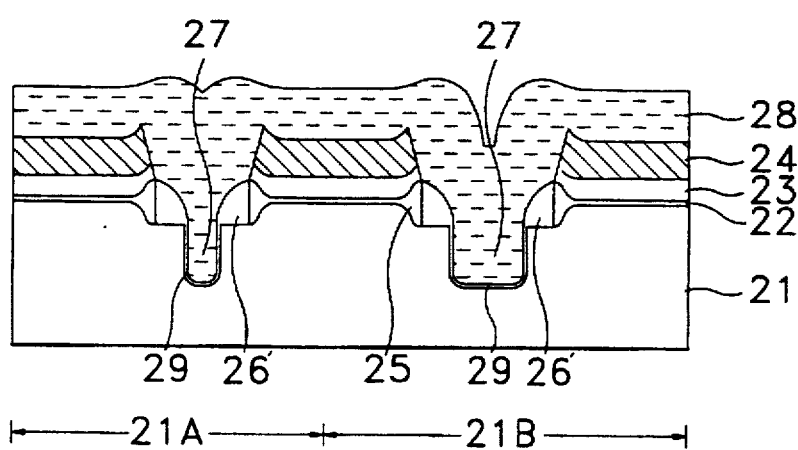

Referring to FIG. 2E, on overall surface of the substrate is a high temperature oxide (HTO) layer 28 deposited at a temperature of 760°–800° C. at a thickness sufficient to fill up the trench 27, for example at a thickness of about 6000–7000 Å, by the low pressure chemical vapor deposition process in a gas atmospher of $SiH_4$ and $N_2O$. At the formation step of HTO layer 28 by the low pressure chemical vapor deposition process, the crystal defects in the etched portion of the damaged substrate is recovered and an oxide thin film 29 of several tens Å thickness is formed within the trench 27.

Figure 2F:
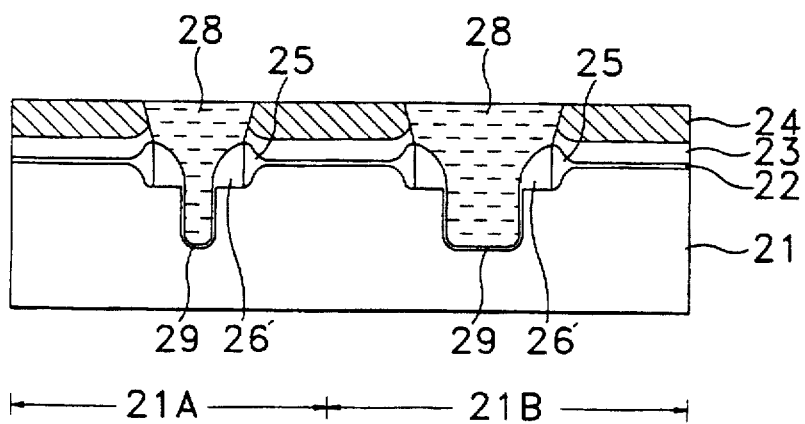

Turning now to FIG. 2F, the HTO layer 28 is etched using the nitride layer 24 as an etch stopper in CMP process, thus forming the planerized surface of the substrate.

Figure 2G:
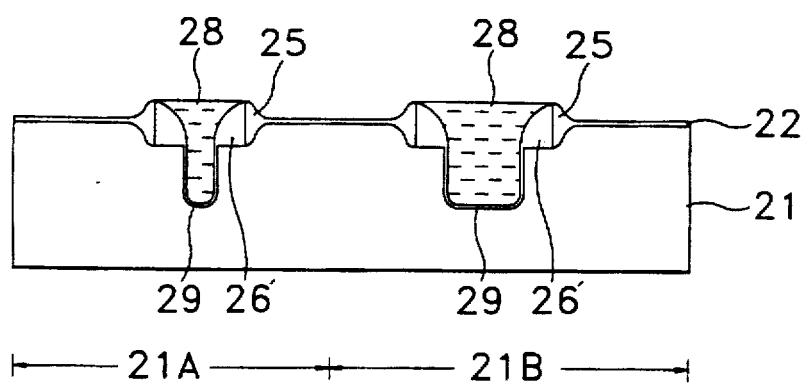

Next, as shown in FIG. 2G, the remaining nitride layer 24 and the buffer polysilicon layer 23 are removed and the pad oxide film 22 is etched unitl the pad oxide film remains at a thickness of 50–150 Å so as to protect the substrate. Therefore, as shown in FIG. 2G, an isolation region in the semiconductor device having the same shape in the cell region 21A and the peripheral region 21B from each other is formed.

As described above, according to the present invention the following advantages and merits is obtained.

First, since the isolation regions, respectively are formed in the same pattern in both the cell region and the peripherical region, the masking process for forming the isolation regions may be performed only once. Therefore, the processes are simple and the yield is enhanced.

Second, regardless of the formation of the isolation regions in the LOCOS process and the trench process, the difference of the surface topology hardly occurs. Therefore, the process margin and the integration density is enhanced.

Third, since the thin field oxide layer is formed in the LOCOS process, the birds beak phenomenon can be decreased. Therefore, the active region is increased and the higher integration circuit fabrication is possible.

Other features, advantages and embodiments of the invention disclosed herein will be readily apparent to those exercising ordinary skill after reading the foregoing disclosures. In this regard, while specific embodiments of the invention have been described in considerable detail, variation and modifications of these embodiments can be effected without departing from the spirit and scope of the invention as described and claimed.

This application is based on Korean Patent Application 96-0444, filed Jan. 11, 1996, which is hereby incorporated by reference in its entirety.

What is claimed is:

1. An isolation method in a semiconductor device, comprising the steps of:
   forming a pad oxide film, a buffer polysilicon layer, and a nitride layer in that order on a semiconductor substrate where cell region and peripheral region having respective device isolation regions are defined;
   etching the nitride layer and the buffer polysilicon layer on the device isolation regions of the cell region and the peripheral region;
   forming a field oxide layer on the device isolation regions of the cell region and the peripheral region;
   etching the field oxide layer except for edge portions to expose the substrate in the device isolation regions of the cell region and the peripheral region;
   forming a first insulating layer on the substrate resulting from the previous etching step;
   etching the first insulating layer, to form a spacer in the side wall of the field oxide layer on the exposed substrate;
   etching the exposed substrate to form a trench;
   forming a second insulating layer on the substrate where the trench is formed, to fill the trench with the second insulating layer;
   etching the second insulating layer to planarize the surface of the substrate; and
   removing the nitride layer and the buffer polysilicon layer.

2. The isolation method in accordance with claim 1, wherein said step of etching the nitride layer and the buffer polysilicon layer is performed such that the remaining thickness of the buffer polysilicon layer is a range of 200–300 Å.

3. The isolation method in accordance with claim 1, wherein said field oxide layer is formed at a thickness range of 2,000–3,000 Å.

4. The isolation method in accordance with claim 1, wherein said first insulating layer is deposited at a thickness range of 1,800–2,000 Å by low pressure chemical vapor deposition method.

5. The isolation method in accordance with claim 4, wherein said first insulating layer is TEOS.

6. The isolation method in accordance with claim 1, wherein said spacer has a width of 0.1–0.2 μm.

7. The isolation method in accordance with claim 1, wherein, said nitride layer and said spacer are used as a mask in the step of etching said substrate for the formation of said trench.

8. The isolation method in accordance with claim 7, wherein said substrate is etched at a depth of 0.1–0.3 μm.

9. The isolation method in accordance with claim 1, wherein said second insulating layer is deposited at a thickness range of 6,000–7,000 Å by low pressure chemical vapor deposition.

10. The isolation method in accordance with claim 9, wherein said second insulating layer is HTO layer.

11. The isolation method in accordance with claim 1, wherein said second insulating layer in the step of etching said second insulating layer is etched by CMP method, where said nitride layer is used as a mask.

* * * * *